United States Patent [19]
Onishi et al.

[11] Patent Number: 4,666,951
[45] Date of Patent: May 19, 1987

[54] PHOTO-CURABLE EPOXY RESIN COMPOSITION

[75] Inventors: Yasunobu Onishi, Yokohama; Shuzi Havase, Kawasaki; Shuichi Suzuki, Yokohama; Moriyasu Wada, Ninomiya, all of Japan

[73] Assignee: Tokyo Shibaura Denki Kabushiki Kaisha, Kawasaki, Japan

[21] Appl. No.: 590,874

[22] Filed: Mar. 19, 1984

[30] Foreign Application Priority Data

Mar. 23, 1983 [JP] Japan .................................. 58-47229

[51] Int. Cl.$^4$ .......................... C08F 2/50; C08F 4/12; C08F 4/18; C08F 4/34
[52] U.S. Cl. ......................................... 522/8; 522/13; 522/24; 522/23; 522/169; 522/170
[58] Field of Search .................... 204/159.24; 522/13, 522/24, 8

[56] References Cited

U.S. PATENT DOCUMENTS 3,708,296  1/1973  Schlesinger ............................ 96/33
4,368,300  1/1983  Nakano et al. ....................... 525/531
4,406,764  9/1983  Hayase et al. ................. 204/159.11
4,437,959  3/1984  Hayase et al. ................. 204/159.11

FOREIGN PATENT DOCUMENTS 1090182  10/1967  United Kingdom .

OTHER PUBLICATIONS

Roffey "Photopolymerization—" 1982, John Wiley & Sons, pp. 67, 68, 78, 102, 110.
Dannley et al. "The Decomposition of Silyl Hydroperoxides" vol. 30, pp. 3848–3851, (J. Org. Chem.).
Crivello et al. "Photoinitiated Cationic Polymerization by Dialkylphenacylsulfonium Salts", vol. 17, pp. 2877–2892; (Journal of Polymer Science).

Primary Examiner—John C. Bleutge
Assistant Examiner—Arthur H. Koeckert
Attorney, Agent, or Firm—Schwartz, Jeffery, Schwaab, Mack, Blumenthal & Evans

[57] ABSTRACT

There is disclosed a photo-curable epoxy resin type composition comprising an epoxy resin, an aluminum compound, a silicon compound having a peroxysilyl group and a photosensitizer.

The compositions of the present invention can suitably be used for wide varieties of electrical applications.

9 Claims, No Drawings

PHOTO-CURABLE EPOXY RESIN COMPOSITION

BACKGROUND OF THE INVENTION

This invention relates to a photo-curable epoxy resin composition, and more particulaly to a photo-curable epoxy resin composition which has been improved in curing characteristics and which provides a cured product having suitable electric characteristics for use as insulating and resist material in electric equipment.

Recently, a process for hardening a resin by the use of a light is attracted attention to save energy and improve operating efficiency in the field of resins. Among others, processes for photo-curable the epoxy resins are regarded as important because of wide range of their possible applications. In a process for photo-curing an epoxy resin, the epoxy resin itself is very important, besides the curing conditions. Thus, compositions having various formulations have widely been studied. The photo-curable epoxy resin compositions, which have hitherto been known to the art, can roughly be classified into two groups.

One is an epoxy resin which has been modified by using a photo-polymerizable compound containing a vinyl group or vinyl groups, such as acrylic acid and its derivatives. However, photo-cured products obtained from the modified epoxy type resins have the defects that heat resistance is considerably inferior to that of photo-cured products obtained from epoxy resins themselves.

The other is an epoxy resin which is added a photo-decomposable catalyst and is to be cured by the catalyst. As the photo-decomposable catalyst used for the purpose, there may be mentioned the complex having the following formula:

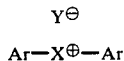

wherein Ar represents a phenyl group; X represents an iodine atom, a sulfur atom or a diazo group; and Y represents $BF_4$, $PF_6$, $AsF_6$ or $SbF_6$.

[See, for example, Macromolecules, Vol. 10, 1307 (1977); Journal of Radiation Curing, Vol. 5, 2 (1978); Journal of Polymer Science, Polymer Chemistry Edition, Vol. 17, 2877 (1979); Ibid. Vol. 17, 1047 (1979); Journal of Polymer Science, Polymer Letters Edition, Vol. 17, 759 (1979); Japanese Provisional Patent Publication No. 65219/1980; U.S. Pat. No. 4,069,054; and British Pat. Nos. 1,516,511 and 1,518,141.]

In case of the epoxy resin compositions which are added the photo-decomposable catalysts, obtained photo-cured products show good mechanical and thermal characteristics. In this case, however, the catalyst components remain as ionic impurities in the photo-cured products so that when such photo-cured products containing the ionic impurities are used in electric equipment, it has the problems that the ionic impurities adversely affect the electric characteristics of the photo-cured products such as an electric insulation ability and sometimes cause an electric equipment or the like to corrode.

It is an object of this invention to provide a photo-curable epoxy resin type composition which may eliminate the above-mentioned disadvantages and has good storability under room temperature and cool-and-dark place, quickly hardens with irradiation of light, particularly of ulraviolet rays, and can be heat-cured at a temperature of not less than 150° C., and gives a cured product containing no ionic impurities, causing no corrosion of a metallic material which is contacted with the cured product and having excellent electrical characteristics.

SUMMARY OF THE INVENTION

As a result of inventive studies made by the present inventors, it was found that the above object can be achieved by using as photo-curing catalysts an aluminum compound and a silicon compound having a peroxysilyl group, in combination with the epoxy resin, and by using further a photosensitizer. The invention has thus accomplished.

Namely, the photo-curable epoxy resin type composition according to this invention comprises:

(a) an epoxy resin,
(b) an aluminum compound,
(c) a silicon compound having a peroxysilyl group, and
(d) a photosensitizer.

DESCRIPTION OF THE PREFERRED EMBODIMENTS

The composition according to this invention will be described more detail in the following.

The epoxy resin which may be used in accordance with the present invention contains an epoxy compound alone or a combination of an epoxy compound with one or more compounds selected from the group consisting of an acid anhydride, a phenol series compound, an ethylenic compound and an imide compound.

The epoxy compound to be used in this invention constitutes a principal component of the composition of this invention. As the epoxy compound, they may be mentioned, for example, a mono-functional epoxy compound and a polyfunctional epoxy compound. Examples of the mono-functional epoxy compounds may include an ethylene oxide, a propylene oxide, a butylene oxide, a styrene oxide, a phenyl glycidyl ether, a butyl glycidyl ether and the like. Examples of the poly-functional epoxy compounds may include a bisphenol A type epoxy resin; a bisphenol F type epoxy resin; a phenol-novolac type epoxy resin; an alicyclic epoxy resin; a heterocyclic ring-containing epoxy resin such as triglycidyl isocyanaurate, hydantoin epoxy, or the like; a hydrogenated bisphenol A type epoxy resin; an aliphatic epoxy resin such as propylene glycol diglycidyl ether, pentaerythritol polyglycidyl ether or the like; a glycidyl ester type epoxy resin obtained by the reaction of an aromatic, aliphatic or alicyclic carboxylic acid with epichlorohydrin; a spiro ring-containing epoxy resin; a glycidyl ether type epoxy resin which is a reaction product of an o-allyl-phenol-novolac compound and epichlorohydrin; a glycidyl ether type epoxy resin which is a reaction product of a diallyl bisphenol compound, having an allyl group at the o-position of each of the hydroxyl groups in bisphenol A, and epichlorohydrin; etc. One or more kinds selected from the group consisting of the above may be used optionally.

As the phenol series compound to be used by being added to the epoxy compound, there may be mentioned bisphenol series compounds such as bisphenol A, bisphenol F, bisphenol S and the like; and a condensate of phenols such as phenol, cresol, catechol, bisphenol A and the like with formaldehyde; etc.

As the ethylenic compound to be used in this invention, there may be mentioned styrene and derivatives thereof; unsaturated carboxylic acids, unsaturated carboxylates; esters of unsaturated carboxylic acids with aliphatic hydroxyl compounds, aliphatic polyhydroxy compounds, aromatic hydroxyl compounds or aromatic polyhydroxy compounds; polycarboxylic acids containing two or more carboxyl groups; oligoesters obtained by esterification reaction of polyhydroxyl compound containing two or more hydroxyl groups and unsaturated carboxylic acids; etc.

Examples of the unsaturated carboxylic acids may include acrylic acid, methacrylic acid, itaconic acid, crotonic acid, isocrotonic acid, maleic acid, etc.

Examples of the aliphatic hydroxyl compounds may include methanol, ethanol, propanol, butanol, etc.

Examples of the aliphatic polyhydroxyl compounds may include dihydric alcohols such as ethylene glycol, triethylene glycol, tetraethylene glycol, tetramethylene glycol, neopentyl glycol, 1,10-decandiol, 1,2-butanediol, 1,3-butanediol and propylene glycol; trihydric alcohol such as trimethylolethane and tetramethylolethane, and a polymer thereof; alcohols containing four or more hydroxyl groups such as pentaerithritol, dipentaerithritol, tripentaerithritol and other polymeric pentaerithritol, saccharides such as sorbitol and D-mannitol; dihydroxycarboxylic acids such as dihydroxymaleic acid, etc.

Examples of the aromatic hydroxyl compounds and the aromatic polyhydroxyl compounds may include phenol, hydroquinone, catechol, resorcinol, phloroglucinol, pyrogallol, etc.

Examples of the esters of aliphatic hydroxyl compounds with unsaturated carboxylic acids may include acrylic esters such as methyl acrylate, ethyl acrylate, n-propyl acrylate, isopropyl acrylate, n-butyl acrylate and tert-butyl acrylate; methacrylic esters such as methyl methacrylate, ethyl methacrylate, n-propyl methacrylate, isopropyl methacrylate, n-butyl methacrylate and tert-butyl methacrylate; itaconic esters such as methyl itaconate, ethyl itaconate, n-propyl itaconate, isopropyl itaconate, n-butyl itaconate and tert-butyl itaconate; crotonic esters such as methyl crotonate, ethyl crotonate, n-propyl crotonate, iso-propyl crotonate, n-butyl crotonate and tert-butyl crotonate; etc.

Examples of the esters of aliphatic polyhydroxyl compound and unsaturated carboxylic acid may include acrylic esters such as ethylene glycol diacrylate, triethylene glycol triacrylate, 1,3-butanediol diacrylate, tetramethylene glycol diacrylate, propylene glycol diacrylate, trimethylolpropane triacrylate, trimethylolethane triacrylate, tetraethylene glycol diacrylate, pentaerithritol diacrylate, pentaerithritol triacrylate, pentaerithritol tetraacrylate, dipentaerithritol diacrylate, dipentaerithritol triacrylate, dipentaerithritol tetraacrylate dipentaerithritol pentaacrylate, dipentaerithritol hexaacrylate, tripentaerithritol octaacrylate, sorbitol triacrylate, sorbitol tetraacrylate, sorbitol pentaacrylate, sorbitol hexaacrylate and polyester acrylate oligomer; methacrylic esters such as tetramethylene glycol dimethacrylate, triethylene glycol dimethacrylate, trimethylolpropane trimethacrylate, trimethylolethane trimethacrylate, pentaerithritol dimethacrylate, pentaerithritol trimethacrylate, dipentaerithritol dimethacrylate, dipentaerithritol tetramethacrylate, tripentaerithritol octamethacrylate, ethylene glycol dimethacrylate, 1,3-butanediol dimethacrylate, tetramethylene glycol dimethacrylate and sorbitol tetramethacrylate; itaconic esters such as ethylene glycol diitaconate, propylene glycol diitaconate, 1,3-butanediol diitaconate, 1,4-butanediol diitaconate, tetramethylene glycol diitaconate, pentaerithritol diitaconate, dipentaerithritol triitaconate, dipentaerithritol pentaitaconate, dipentaerithritol hexaitaconate and sorbitol tetraitaconate; crotonic esters such as ethylene glycol dicrotonate, propylene glycol dicrotonate, tetramethylene glycol dicrotonate, pentaerithritol dicrotonate and sorbitol tetracrotonate; isocrotonic esters such as ethylene glycol diisocrotonate, pentaerithritol diisocrotonate and sorbitol tetraisocrotonate; maleic esters such as ethylene glycol dimaleate, triethylene glycol dimaleate, pentaerithritol dimaleate and sorbitol tetramaleate; and a mixture of some of these esters.

Examples of the oligoesters may include oligoester acrylate and oligoester methacrylate (hereinafter referred to merely as oligoester (metha)acrylate, thereby representing both or either one of these).

The oligoester (metha)acrylate is a reaction product obtained by esterification reaction of acrylic or methacrylic acid and a polycarboxylic acid with a polyol, and is assumed to have a chemical structure of the formula:

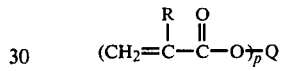

(wherein, R represents a hydrogen atom or a methyl group, Q represents a residue having at least one ester bond and being formed by condensation of the polyol and the polycarboxylic acid, and p is an integer of 1 to 6).

Example of the polyol giving the residue represented by Q may include polyols such as ethylene glycol, 1,2-propylene glycol, 1,4-butanediol, 1,6-hexanediol, trimethylolpropane, trimethylolethane, 1,2,6-hexanetriol, glycerol, pentaerithritol and sorbitol; polyether type polyols such as diethylene glycol, triethylene glycol, tetraethylene glycol, decaethylene glycol, polyethylene glycol, dipropylene glycol, tripropylene glycol, tetrapropylene glycol and polypropylene glycol, etc.

Examples of the polycarboxylic acid giving the residue represented by Q may include aromatic polycarboxylic acids such as phthalic acid, isophthalic acid, terephthalic acid, tetrachlorophthalic acid, tetrabromophthalic acid, trimellitic acid, pyromellitic acid, benzophenone dicarboxylic acid and resorcinol diacetic acid; unsaturated aliphtic polycarboxylic acids such as maleic acid, fumaric acid, Himic Acid (trademark, produced by Hitachi Chemical Co., Ltd.) and itaconic acid; saturated aliphatic polycarboxylic acid such as malonic acid succinic acid, glutaric acid, adipic acid, pimelic acid, sebacic acid, dodecanoic acid and tetrahydrophthalic acid, etc.

As the acid anhydride which may be used in the invention, there may include phthalic anhydride, tetrahydrophthalic anhydride, methyltetrahydrophthalic anhydride, hexahydrophthalic anhydride, methylhexahydrophthalic anhydride, maleic anhydride, trimellitic anhydride and hexachloroendomethylenetetrahydrophthalic anhydride.

As the imide compound which may be used in this invention, a maleimide represented by the following general formula:

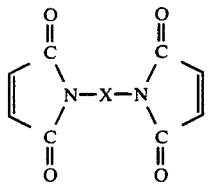

(wherein X represents a divalent hydrocarbon group such as an alkylene group, a cycloalkylene group, a monocyclic or polycyclic arylene group or the like, or a divalent hydrocarbon group being combined with a divalent group such as —CH$_2$—, —CO—, —SO$_2$—, —CONH— or the like), is preferable. Examples of the maleimide compound may include N,N'-phenylenebismaleimide, N,N'-hexamethylenebismaleimide, N,N'-methylene-di-p-phenylenebismaleimide, N,N'-oxy-di-p-phenylenebismaleimide, N,N'-4,4'-benzophenonebismaleimide, N,N'-(3,3'-dimethylene-di-p-phenylenebismaleimide, N,N'-methatoluilenebismaleimide and the like.

Each of the acid anhydrides and the phenol series compounds may be mixed in the range of not more than 1 in terms of weight ratio based on the epoxy compound, respectively.

The aluminum compound to be used in this invention may be either inorganic aluminum compounds or organic aluminum compounds, but is preferably compounds having an organic group selected from the group consisting of an alkoxy group, a phenoxy group, an acyloxy group, a β-diketonato group, an o-carbonylphenolato group, etc.

Of the above organic groups, examples of the alkoxy group may include a methoxy group, an ethoxy group, an isopropoxy group, a butoxy group, a pentoxy group, etc.; examples of the phenoxy group may include a phenoxy group, an o-methylphenoxy group, an o-methoxyphenoxy group, a p-nitrophenoxy group, a 2,6-dimethylphenoxy group, etc.; examples of the acyloxy group may include an acetato group, a propionato group, an isopropionato group, a butylato group, a stearato group, an ethylacetoacetato group, a propylacetoacetato group, an isopropylacetoacetato group, an n-butylacetoacetato group, a sec-butylacetoacetato group, a diethylmalonato group, a dipivalaloylmethanato group, etc.; examples of the β-diketoanto group may include an acetylacetonato group, a trifluoroacetylacetonato group, a hexafluoroacetylacetonato group,

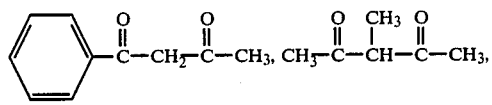

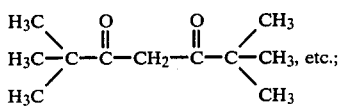

and examples of the o-carbonylphenolato group may include a salicylaldehydato group, etc.

More specifically, examples of the aluminum compounds mentioned above may include trismethoxyaluminum, trisethoxyaluminum, trisisopropoxyaluminum, trisphenoxyaluminum, trisparamethylphenoxyaluminum, isopropoxydiethoxyaluminum, trisbutoxyaluminum, trisacetoxyaluminum, trisstearatoaluminum, trisbutyratoaluminum, trispropionatoaluminum, trisisopropionatoaluminum, trisacetylacetonatoaluminum, tris(trifluoroacetylacetonato)aluminum, tris(hexafluoroacetylacetonato)aluminum, trisethylacetoacetatoaluminum, trissalicylaldehydatoaluminum, tris(diethylmalonato)aluminum, trispropylacetoacetatoaluminum, trisbutylacetoacetatoaluminum, tris(dipivaloylmethanato)aluminum, diacetylacetonatodipivaloylmethanatoaluminum,

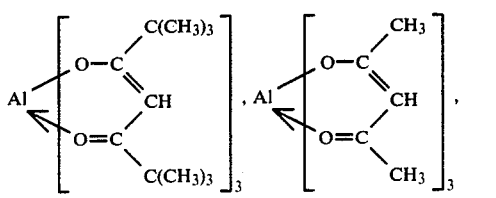

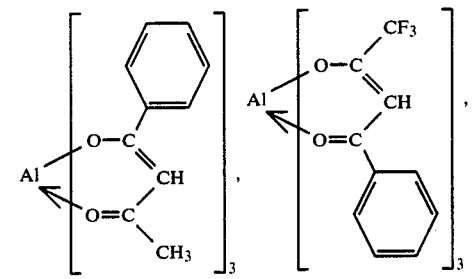

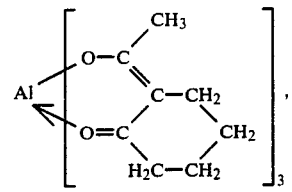

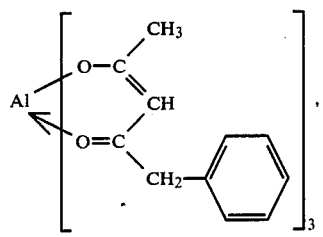

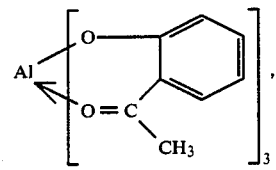

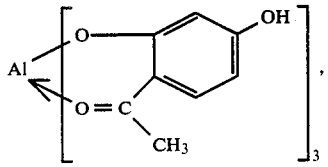

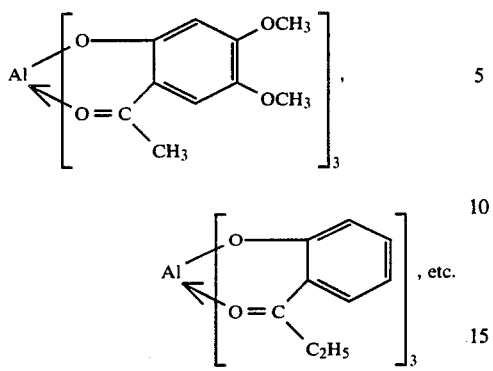

These aluminum compounds may be used independently or in admixture with one another. They are generally used in an amount of 0.001 to 10% by weight, preferably 0.05 to 5% by weight based on the epoxy resins. An amount of the aluminum compounds below 0.001% by weight cannot give sufficient curing characteristics, on the other hand, an amount thereof in excess of 10% by weight would make cost of the compositions expensive and cause the electric characteristics to deteriorate.

The silicon compound having a peroxysilyl group to be used in this invention is represented by the following formula:

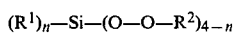

(wherein $R^1$ represents a hydrogen atom, a halogen atom, an alkyl group having from 1 to 5 carbon atoms, a vinyl group, an alkoxy group having from 1 to 5 carbon atoms or a substituted or unsubstituted aryl group; $R^2$ represents a hydrogen atom, an alkyl group having from 1 to 10 carbon atoms or a substituted or unsubstituted aryl group and n is an integer of 0 to 3).

In the above formula, examples of the alkyl group of $R^1$ having 1 to 5 carbon atoms may include a methyl group, an ethyl group, an isopropyl group, a n-propyl group, a n-butyl group, a tert-butyl group, a sec-butyl group, a n-pentyl group, etc.; examples of the alkoxy group having 1 to 5 carbon atoms may include a methoxy group, an ethoxy group, an isopropoxy group, a n-butoxy group, an n-pentyloxy group, etc.; examples of the aryl group may include a phenyl group, a naphthyl group, an anthranyl group, a benzyl group, an $\alpha,\alpha'$-dimethylbenzyl group, a 1,2,3,4-tetrahydro-1-naphthyl group, etc; and examples of the alkyl group of $R^2$ having 1 to 10 carbon atoms may include a methyl group, an ethyl group, an isopropyl group, an n-propyl group, a n-butyl group, a tert-butyl group, a sec-butyl group, a n-pentyl group, a hexyl group, a heptyl group, an octyl group, a nonyl group, a decyl group, etc. The alkyl group having 1 to 5 carbon atoms and the aryl group may have a substituents such as a halogen atom, a haloalkyl group, a nitro group, a cyano group, a methoxy group or the like.

Examples of the silicon compounds having the peroxysilyl group may include compounds of the following formulas:

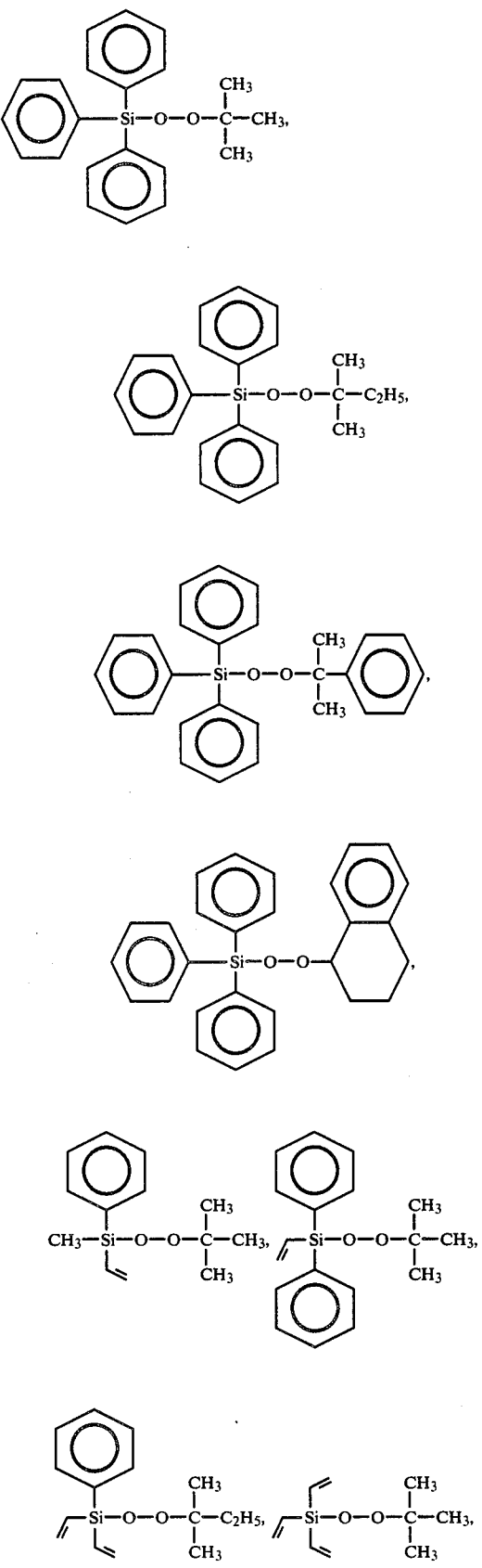

-continued

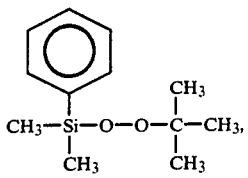

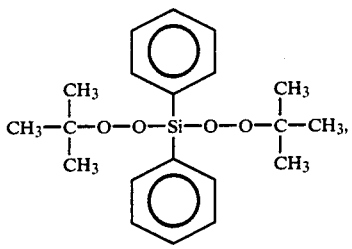

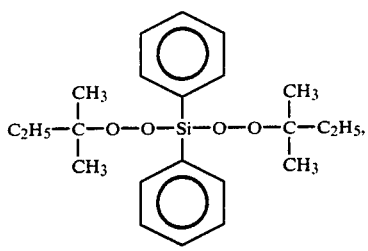

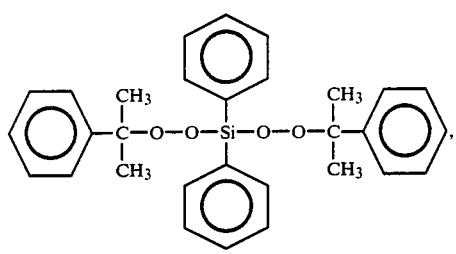

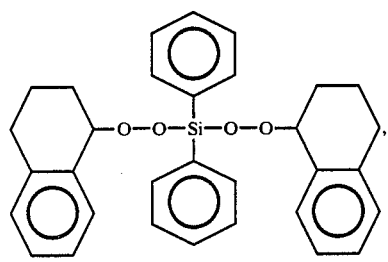

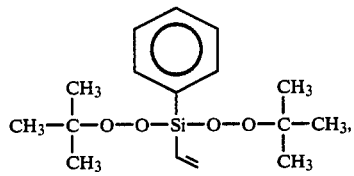

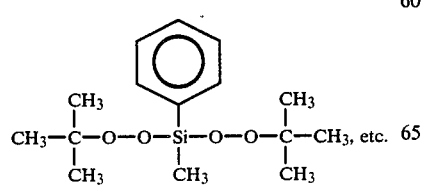

These silicon compounds are preferably used in an amount of 0.1 to 20% by weight, more preferably 1 to 10% by weight, based on the epoxy resin. An amount of the silicon compound below 0.1% by weight cannot give sufficient curing characteristics, on the contrary an amount thereof in excess of 20% by weight can also be used, but would make the compositions expensive and would present a problem concerning decomposition products of the catalyst components.

As the photosensitizer used in this invention, there may be employed any of those which are capable of photosensitizing the foregoing compounds, and which are selected depending on the kinds of the epoxy resins, light source, etc.

Examples of the above photosensitizers may include aromatic hydrocarbons, benzophenone and derivatives thereof, esters of o-benzoylbenzoic acids, acetophenone and derivatives thereof, benzoin and benzoin ethers and derivatives thereof, xanthone and derivatives thereof, thioxanthone and derivatives thereof, disulfide compounds, quinone compounds, halogenated hydrocarbons, amines, etc.

Examples of the aromatic hydrocarbon may include benzene, benzene-d6, toluene, p-xylene, fluorobenzene, chlorobenzene, bromobenzene, iodobenzene, naphthalene, 1-methylnaphthalene, 2-methylnaphthalene, 1-fluoronaphthalene, 1-chloronaphthalene, 2-chloronaphthalene, 1-bromonaphthalene, 2-bromonaphthalene, 1-iodonaphthalene, 2-iodonaphthalene, 1-naphthol, 2-naphthol, biphenyl, fluorene, p-terphenyl, acenaphthene, p-quaterphenyl, triphenylene, phenanthrene, azulene, fluoranthene, chrycene, pyrene, 1,2-benzpyrene, anthracene, 1,2-benzanthracene, 9,10-dichloroanthracene, 9,10-dibromoanthracene, 9,10-diphenylanthracene, perylene, tetracene, pentacene, etc.

Examples of the benzophenone and the derivatives thereof may include benzophenone, 2,4-dimethylbenzophenone, 2,4-dichlorobenzophenone, 4,4'-bis(dimethylamino)benzophenone, etc.

Examples of the esters o-benzoylbenzoic acids may include methyl o-benzoylbenzoate, ethyl o-benzoylbenzoate, phenyl o-benzoylbenzoate,

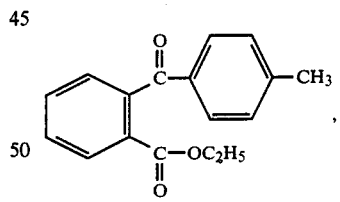

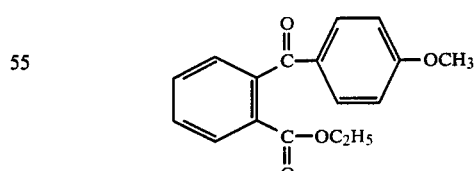

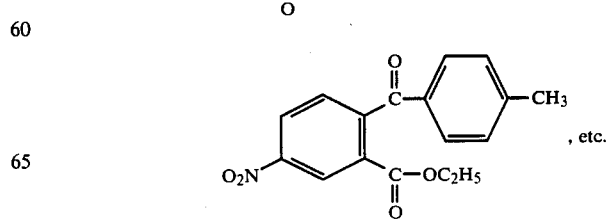

, etc.

Examples of the acetophenone and the derivatives thereof may include acetophenone, 4-methylacetophenone, 3-methylacetophenone, 3-methoxyacetophenone, etc.

Examples of the benzoin, the benzoin ethers and the derivatives of these may include benzoin, benzoin methyl ether, benzoin ethyl ether, benzoin isopropyl ether, benzoin n-butyl ether, benzoin triphenylsilyl ether,

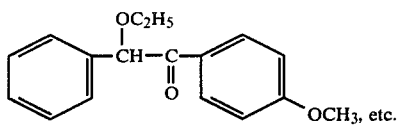

Examples of the xanthone and the derivatives thereof may include xanthone, 2,4-dimethylxanthone, 2,4-dichloroxanthone, etc.

Examples of the thioxanthone and the derivatives thereof may include thioxanthone, 2,4-dimethylthioxanthone, 2,4-dichlorothioxane, etc.

Examples of the disulfide compounds may include;

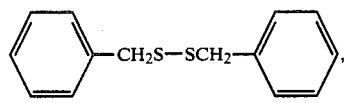

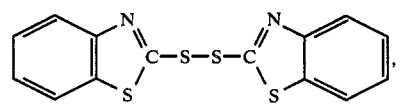

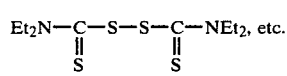

Examples of the quinone series compounds may include benzoquinone, naphthoquinone, anthraquinone, 5,12-naphthacene dione, 2,7-pyrene dione, etc.

Examples of the halogenated hydrocarbons may include carbon tetrachloride, hexachloroethane, carbon tetrabromide,

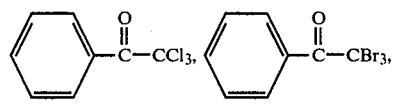

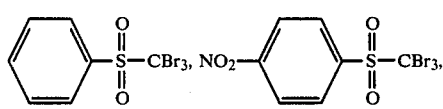

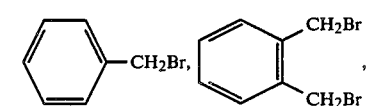

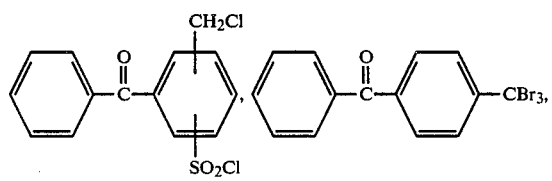

-continued

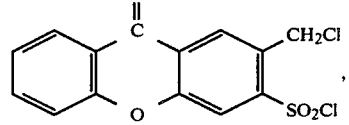

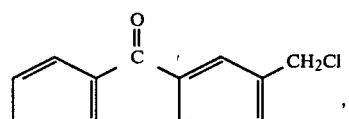

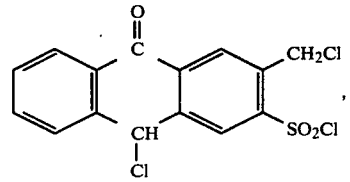

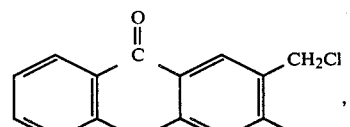

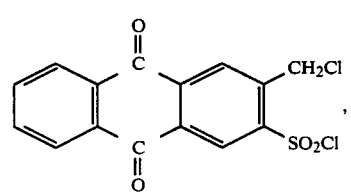

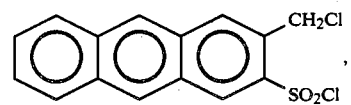

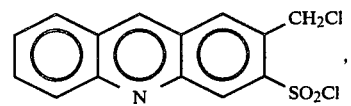

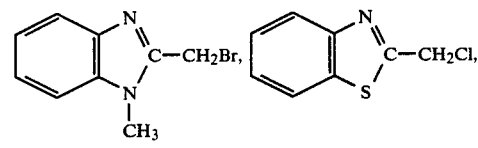

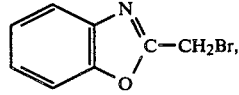

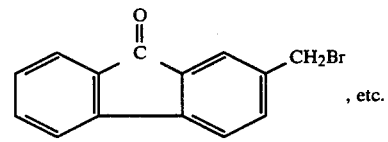

Examples of the amines may include diphenylamine, carbazole, triphenylamine,

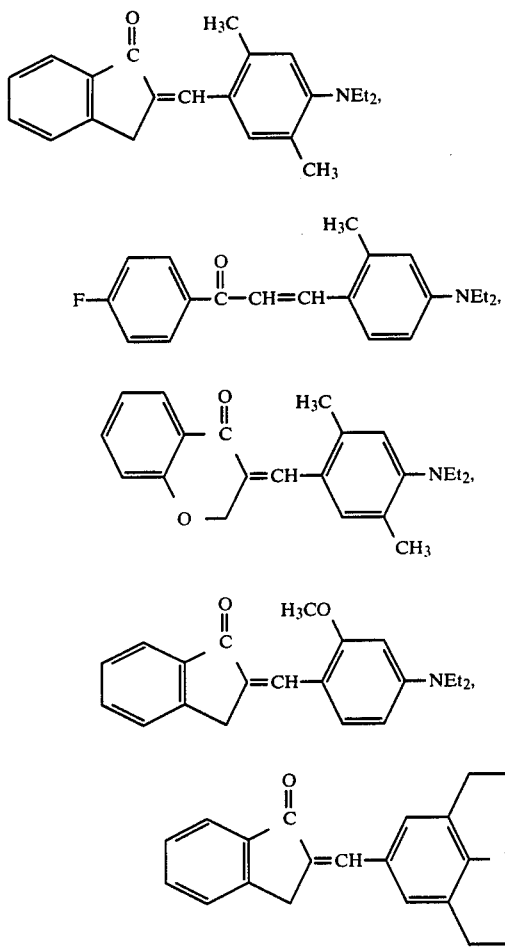

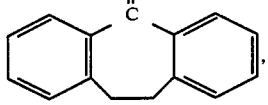

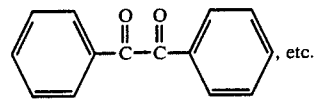

Examples of the other photosensitizers may include propiophenone, anthrone, benzaldehyde, butylophenone, 2-naphthylphenylketone, 2-naphthaldehyde, 2-acetonaphthone, 1-naphthylphenylketone, 1-acetonaphthone, 1-naphtholaldehyde, fluorenone, 1-phenyl-1,2-propane dione, benzoethrile, acetone, biacetyl, acridine orange, acridine, Rhodamine-B, eosine, fluorescein,

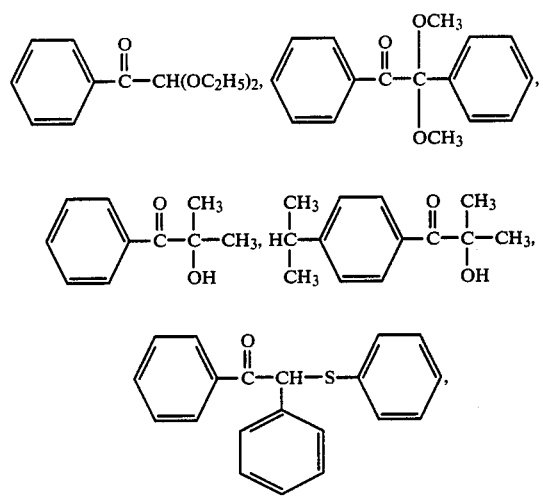

The photosensitizers exemplified in the above may be used alone or in combination, and should be mixed preferably in an amount of from 0.001 to 10% by weight, more preferably 0.01 to 5% by weight, based on the epoxy resin.

The photo-curable compositions of the present invention can be cured by methods such as room-temperature photo-curing, high-temperature photo-curing, after-cure which is effected after the photo-curing, etc. The wavelength of light necessary for the photo-curing will generally be from 180 nm to 700 nm, preferably from 250 nm to 500 nm; the irradiation time will generally be from 10 sec. to 180 min., preferably from 30 sec. to 30 min., depending on the epoxy resin composition and the catalyst to be used; and the temperature in case of high-temperature photo-curing will generally be from 20° C. to 200° C., preferably from 60° C. to 120° C., depending on the epoxy resin composition and the catalyst to be used. Examples of the light source to be used in this invention may include a high-pressure mercury-vapor lamp, a carbon arc lamp, a xenon lamp, an argon glow discharge tube and the like. In case of after-cure which is effected after the photo-curing will generally be carried out at 50° C. to 200° C., preferably at 100° C. to 180° C., and effected for 1 to 10 hrs., preferably for 2 to 5 hrs., depending on the epoxy resin composition and the catalyst to be used.

This invention will be described in greater detail by giving the following Examples.

EXAMPLE 1

10 g of ERL 4221 (trade name, available from UCC Co. Ltd.; an alicyclic epoxy resin having following formula [1]), 0.3 g of tris(propylacetoacetato)aluminum, 0.5 g of t-butylperoxytriphenylsilane and 0.1 g of benzophenone were mixed and homogeneously dissolved.

The thus obtained photo-curable epoxy resin series composition was applied onto an aluminum plate and exposed to light emitted from a high-pressure mercury-vapor lamp (80 W/cm) (available from Tokyo Shibaura Denki K.K.) at a distance from 15 cm, the composition was cured within 1 minute.

On the other hand, the same composition mentioned above except that benzophenone was not added was prepared and exposed to light in the same conditions as mentioned above, the cured product was not obtained within 1 minute.

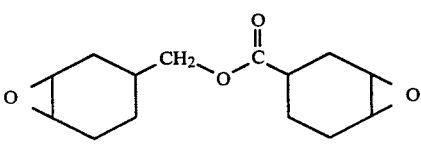

[1]

EXAMPLE 2

10 g of ERL 4206 (trade name, available from UCC Co. Ltd.; an epoxy compound having following formula [2], epoxy equivalent; 70, molecular weight: 139), 4 g of Epikote 828 (trade name, available from Shell Kagaku K.K., Japan; bisphenol A type epoxy resin, epoxy equivalent: 190–210, molecular weight: 380), 0.5 g of tris(ethylacetoacetato)aluminum, 0.5 g of di(t-butylperoxy)diphenylsilane and 0.1 g of benzoin ethyl ether were mixed and homogenously dissolved.

The thus obtained photo-curable epoxy resin series composition was applied onto an aluminum plate and exposed to light for 1 minute in the same manner as in Example 1, the reaction system had already been gelled.

On the other hand, when the same composition mentioned above, except that benzoin ethyl ether was not added, was prepared and exposed to light in the same conditions as mentioned above, only a soft gellated prodect has been formed after a one minute exposure.

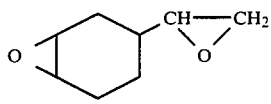

[2]

EXAMPLE 3

100 g of ERL 4221, 30 g of Epikote 154 (trade name, available from Shell Kagaku K.K., Japan; phenol novolac type epoxy resin, epoxy equivalent: 172–180), 10 g of Epikote 828, 0.3 g of tris(salicylaldehydato)aluminum, 4 g of t-butylperoxytriphenylsilane and 0.5 g of thioxanthone were mixed and homogeneously dissolved.

The thus obtained photo-curable epoxy resin series composition was applied onto an aluminum plate. When exposed to an ultra-violet ray emitted from a mercury lamp (80 W/cm) for 1 minute, there was yielded a satisfactory cured resin plate. Measurement of the electric characteristics of the cured resin plate indicated that a dielectric loss tangent value (tan $\delta$) thereof was 2.0% at 100° C.

The cured resin plate was then after-cured at 130° C. for 5 hours and the tan $\delta$ value thereof was measured again to be 4.5% at 180° C.

EXAMPLE 4

60 g of ERL 4221, 20 g of Epikote 152 (Trade Name, available from Shell Kagaku K.K., Japan; phenol novolac type epoxy resin, epoxy equivalent: 172–179), 2 g of tris(saliycilaldehydato)aluminum, 4 g of t-butylperoxytriphenylsilane and 0.5 g of benzil were mixed and homogeneously dissolved.

The thus obtained photo-curable epoxy resin series composition was applied onto an aluminum plate. When exposed to a light for 1 minute in the same manner as in Example 3, there was yielded a satisfactory cured resin plate.

Measurement of the characteristics of the cured resin plate indicated that a dielectric loss tangent value (tan $\delta$) and a volume resistivity thereof were 3.7% and $2.5 \times 10^{13}$ $\Omega$m, respectively, at 100° C.

The cured resin plate was then after-cured at 130° C. for 5 hours and the tan $\delta$ value thereof was measured again to be 4.5% at 180° C.

COMPARATIVE EXAMPLE 1

100 g of ERL 4221, 30 g of epikote 828 and 0.3 g of diphenyliodoniumtetrafluoroborate were mixed and homogeneously dissolved.

The thus obtained photo-curable epoxy resin series composition was applied onto an aluminum plate and exposed to light for 1 minute in the same manner as in Example 3.

When an attempt was made to after-cure the resin plate and measure the tan $\delta$ value thereof, sufficient curing could not be obtained to permit the tan $\delta$ measurement, in contrast to the above-mentioned examples.

As will be seen from the obtained results, the composition of the present invention quickly harden when exposed to light and it is confirmed tht the electric insulating characteristics of the obtained cured product are extremely excellent.

EXAMPLES 5 TO 19

Fifteen kinds of photo-curable epoxy resin type compositions each having the composition as shown in Table 1 were prepared.

As shown in Table 1, employed as epoxy resin were ERL 4221 (trade name, available from UCC Co. Ltd.; the alicyclic epoxy resin), ERL 4206 (trade name, available from ditto), ERL 4234 (trade name, available from ditto, an alicyclic epoxy resin having following formula [3], epoxy equivalent: about 140), Epikote 828 (trade name, available from Shell Kagaku K.K., Japan; bisphenol A type epoxy resin, epoxy equivalent: 190–210, molecular weight: 380), Epikote 1001 (trade name, available from ditto, epoxy equivalent: 450 to 525, molecular weight: 900) and Epikote 1004 (trade name, available from ditto, epoxy equivalent: 900 to 1000, molecular weight: about 1400).

As phenol series compounds, employed were bisphenol A and catechol.

As ethylenic compounds, employed were (1) trimethylolpropane triacrylate and (2) pentaerythrytol dimethacrylate.

As acid anhydrides, employed were (3) epichlone B-570 (trade name, available from Dainippon Ink and Chemicals, Inc., methyl-$\Delta^4$-tetrahydrophthalic anhydride) and (4) Likacid MH-700 (trade name, available from Shin-nippon Rika Co., Ltd., methylhexahydrophthalic anhydride). As imide compounds, employed were (5) N,N'-phenylenebismaleimide and (6) N,N'-4,4'-benzophenonebismaleimide.

Further, as aluminum compounds, employed were;
(i) trisacetylacetonatoaluminum,
(ii) tris(ethylacetoacetato)aluminum,
(iii) tris(n-butylacetylacetato)aluminum, and
(iv) trissalicylaldehydatoaluminum.

Moreover, as silicon compounds, employed were;
(a) triphenyl(t-butylperoxy)silane,
(b) triphenyl($\alpha,\alpha'$-dimethylbenzylperoxy)silane,
(c) vinyldiphenyl(tert-butylperoxy)silane, and
(d) diphenyl($\alpha,\alpha'$-dimethylbenzylperoxy)silane.

As sensitizers, employed were (A) naphthacene, (B) benzophenone, (C) benzoin isopropyl ether and (D) 2,4-dimethylthioxantone.

By the use of the above, the photo-curable epoxy resin type compositions were each applied onto an aluminum plate, and as to the compositions of Examples 5 to 13, they were subjected to ultraviolet cure by passing them at a speed of 1 m/min. through a curing box having a length of 2 m which was provided three sets of high-pressure mercury lamps H2000L/81N (available from Tokyo Shibaura Denki K.K.) of 2 KW each. As to the compositions of Examples 14 to 19, after they were subjected to the same treatment as mentioned above, they were treated a post-curing at 150° C. for 2 hours. The thus obtained each cured product was measured a tan δ value thereof. The obtained results are also shown in Table 1.

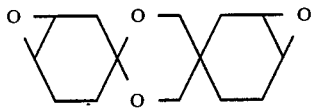

[3]

TABLE 1

| Components et al. | Example No. | | | | | | | | | | | | | | |
|---|---|---|---|---|---|---|---|---|---|---|---|---|---|---|---|
| | 5 | 6 | 7 | 8 | 9 | 10 | 11 | 12 | 13 | 14 | 15 | 16 | 17 | 18 | 19 |
| Epoxy reins: | | | | | | | | | | | | | | | |
| ERL 4221 | 60 | 60 | 50 | 50 | 50 | 40 | 60 | 60 | 40 | 10 | 10 | 10 | 10 | — | — |
| ERL 4206 | — | — | 10 | — | — | 10 | — | — | — | — | — | 10 | — | — | — |
| ERL 4234 | — | — | — | 10 | — | — | — | — | — | — | — | — | — | — | — |
| Epikote 828 | 20 | — | — | 10 | 10 | — | 20 | — | — | 60 | 60 | 60 | 60 | 50 | 60 |
| Epikote 1001 | — | 20 | — | — | — | 10 | — | 20 | — | 30 | — | — | — | — | — |
| Epikote 1004 | — | — | 20 | 10 | — | — | — | — | 10 | — | 30 | — | 20 | — | — |
| Bisphenol A | 20 | — | — | — | — | — | — | — | — | — | 20 | — | — | — | — |
| Catechol | — | 20 | — | 10 | — | — | — | — | 5 | — | — | — | — | 10 | — |
| Ethylenic compound (1) | — | — | 20 | — | — | — | — | — | — | — | 20 | — | — | — | — |
| Ethylenic compound (2) | — | — | — | 20 | — | — | — | — | 5 | — | — | — | — | 10 | — |
| Acid anhydride (3) | — | — | — | — | 40 | — | — | — | — | — | — | 20 | — | — | 30 |
| Acid anhydride (4) | — | — | — | — | — | 40 | — | — | 30 | — | — | — | — | 20 | — |
| Imide compound (5) | — | — | — | — | — | — | 20 | — | 10 | — | — | — | 10 | 10 | — |
| Imide compound (6) | — | — | — | — | — | — | — | 20 | — | — | — | — | — | — | 10 |
| Aluminum compounds: | | | | | | | | | | | | | | | |
| (i) | 2 | — | — | — | — | — | — | 2 | — | — | — | — | — | — | — |
| (ii) | — | 2 | — | — | — | 2 | — | 2 | — | 2 | — | 2 | — | — | 2 |
| (iii) | — | — | 2 | — | — | 2 | — | 2 | — | 2 | — | 2 | — | — | 2 |
| (iv) | — | — | — | 2 | 2 | — | — | — | 2 | — | — | — | 2 | 2 | — |
| Silicon compounds: | | | | | | | | | | | | | | | |
| (a) | 2 | — | — | — | — | — | 2 | — | — | 2 | — | — | — | — | — |
| (b) | — | 2 | — | — | 2 | — | — | — | — | — | — | — | 2 | 2 | — |
| (c) | — | — | 2 | — | — | 2 | — | — | — | — | — | 2 | — | — | 2 |
| (d) | — | — | — | 2 | — | — | — | 2 | 2 | — | 2 | — | — | — | — |
| Photo-sensitizer: | | | | | | | | | | | | | | | |
| (A) | 0.2 | — | — | — | — | — | — | — | — | — | — | — | 0.1 | — | — |
| (B) | — | 0.2 | — | — | — | 0.2 | — | — | 0.1 | — | — | — | 0.1 | — | — |
| (C) | — | — | 0.2 | — | 0.2 | — | 0.2 | — | 0.2 | — | 0.1 | — | — | — | 0.1 |
| (D) | — | — | — | 0.2 | — | — | — | 0.2 | — | — | — | 0.1 | — | — | — |
| tan δ (%) 150° C. | 1.8 | 1.2 | 1.5 | 1.1 | 1.4 | 1.7 | 1.6 | 1.5 | 1.8 | 2.3 | 3.2 | 2.5 | 2.9 | 1.3 | 2.2 |
| 180° C. | 2.7 | 2.1 | 2.4 | 2.0 | 2.5 | 2.8 | 2.9 | 3.1 | 3.0 | 4.1 | 4.3 | 3.7 | 4.3 | 2.1 | 3.9 |

As is clear from the above results, the compositions of the present invention quickly harden when exposed to light and give cured products which show extremely excellent electric insulating characteristics.

The photo-curable epoxy resin type compositions of the present invention harden in short time when exposed to light due to the use of an aluminum compound and a silicon compound having a peroxysilyl group as catalyst components. Moreover, the obtained cured product is extremely excellent in the electric characteristics such as a tan δ value since it contains no ionic impurities, and thereby does not cause the corrosion of an electric appliance when the product is used in the electric appliance. Therefore, the cured product can be used for wide variations of applications such as resist materials and insulating materials for electric appliances, particularly for coils. It should thus be concluded that the industrial value of the photo-curable epoxy resin is extremely great.

We claim:

1. A photo-curable epoxy resin composition which consists essentially of:
   (a) an epoxy resin,
   (b) an organic aluminum compound,
   (c) a silicon compound having a peroxysilyl group, and
   (d) a photosensitizer which is other than said compounds (b) and (c), said photosensitizer being capable of photosensitizing said compound (c), such that said composition, when cured, contains no ionic impurities, said photosensitizer being at least one selected from the group consisting of an aromatic hydrocarbon, a benzophenone, an acetophenone, a benzoin, a benzoin ether, a xanthone, a thioxanthone, a disulfide, a quinone, a halogenated hydrocarbon, benzil and an amine.

2. A photo-curable epoxy resin composition according to claim 1, wherein said compound (a) consists essentially of an epoxy compound alone or a combination of an epoxy compound with at least one compound selected from the group consisting of an acid anhydride, a phenol series compound, an ethylenic compound and an imide compound.

3. A photo-curable epoxy resin composition according to claim 2, wherein said ethylenic compound is at least one compound selected from the group consisting of a styrene and derivatives thereof; an unsaturated carboxylic acid, an unsaturated carboxylate; an ester of an unsaturated carboxylic acid with an aliphatic hydroxyl compound, an aliphatic polyhydroxy compound, an aromatic hydroxyl compound or an aromatic polyhydroxy compound; a polycarboxylic acid containing two or more carboxyl groups; and an oligoester obtained by esterifiction reaction of a polyhydroxyl compound containing two or more hydroxyl groups and an unsaturated carboxylic acid.

4. A photo-curable epoxy resin composition according to claim 1, wherein said organic aluminum compound has an organic group selected from the group consisting of an alkoxy group, a phenoxy group, an acyloxy group, a β-diketonato group and an o-carbonylphenolato group.

5. A photo-curable epoxy resin composition according to claim 1, wherein said silicon compound having a peroxysilyl group has the following general formula:

$$(R^1)_n\text{—Si—}(O\text{—}O\text{—}R^2)_{4-n}$$

wherein $R^1$ represents a hydrogen atom, a halogen atom, an alkyl group having from 1 to 5 carbon atoms, a vinyl group, an alkoxy group having from 1 to 5 carbon atoms or a substituted or unsubstituted aryl group; $R^2$ represents a hydrogen atom, an alkyl group having from 1 to 10 carbon atoms or a substituted or unsubstituted aryl group; and n is an integer of 0 to 3.

6. A photo-curable epoxy resin composition according to claim 1, wherein said aluminum compound and silicon compound having a peroxysilyl group are used in amounts of 0.001 to 10% by weight and 0.01 to 20% by weight based on the epoxy resin, respectively.

7. A photo-curable epoxy resin composition according to claim 6, wherein said photosensitizer is used in an amount of 0.01 to 20% by weight based on the epoxy resin.

8. A photo-curable epoxy resin composition according to claim 1, wherein said silicon compound having a peroxysilyl group is substituted by two or three aryl groups directly linked to a silicon atom.

9. A photo-curable epoxy resin composition according to claim 1, wherein said photosensitizer is selected from the group consisting of benzophenone, benzoin ethyl ether, benzoin isopropyl ether, thioxanthone, 2,4-dimethylthioxanthone and naphthalene.

* * * * *